(12) United States Patent
Nishihara et al.

(10) Patent No.: US 10,705,377 B2
(45) Date of Patent: Jul. 7, 2020

(54) LIQUID CRYSTAL DISPLAY DEVICE AND METHOD OF CONTROLLING THE SAME

(71) Applicant: SHARP KABUSHIKI KAISHA, Sakai, Osaka (JP)

(72) Inventors: Yasutomo Nishihara, Sakai (JP); Hideo Tohdoh, Sakai (JP); Kohichi Ohhara, Sakai (JP); Takuya Handa, Sakai (JP); Kohji Michibayashi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/449,226

(22) Filed: Jun. 21, 2019

(65) Prior Publication Data

US 2020/0004084 A1  Jan. 2, 2020

Related U.S. Application Data

(60) Provisional application No. 62/692,442, filed on Jun. 29, 2018.

(51) Int. Cl.
*G02F 1/13357* (2006.01)
*G09G 3/36* (2006.01)
(Continued)

(52) U.S. Cl.
CPC .... *G02F 1/133603* (2013.01); *G02F 1/13306* (2013.01); *G09G 3/3648* (2013.01); *H03K 7/08* (2013.01)

(58) Field of Classification Search
CPC .............. G09G 3/3648; G09G 3/3426; G09G 2330/045; G09G 3/006; G09G 2330/12;
(Continued)

(56) References Cited

U.S. PATENT DOCUMENTS

2005/0057191 A1* 3/2005 Jo ......................... G09G 3/3233
315/291
2011/0273104 A1* 11/2011 Uchimoto ............ G09G 3/3406
315/210
(Continued)

FOREIGN PATENT DOCUMENTS

JP    2011-216876 A   10/2011
JP    2016-129098 A   7/2016
WO   2015/041012 A1   3/2015

*Primary Examiner* — Kevin Quarterman
(74) *Attorney, Agent, or Firm* — ScienBiziP, P.C.

(57) ABSTRACT

A liquid crystal display device including a display unit, a backlight including a plurality of light sources, an LED control circuit configured to output a PWM signal (LED control signal) based on a display synchronization signal, such that the light sources are intermittently lighted, and an LED driver configured to control a drive current that is supplied to the light sources, based on the PWM signal, is provided with a monitoring control unit that is configured to perform monitoring at least one of the PWM signal, the drive current, and the display synchronization signal, as a monitoring target. When an abnormality of the monitoring target is detected, the monitoring control unit controls a waveform of the PWM signal such that the drive current that is supplied to the light sources in the backlight becomes zero.

13 Claims, 6 Drawing Sheets

(51) Int. Cl.
*H03K 7/08* (2006.01)
*G02F 1/133* (2006.01)

(58) Field of Classification Search
CPC ....... G09G 2330/10; G09G 2320/0646; G09G 2320/029; G09G 2320/064; G02F 1/133603; G02F 1/13306; H03K 7/08
See application file for complete search history.

(56) References Cited

U.S. PATENT DOCUMENTS

2014/0159614 A1* 6/2014 Hussain ................ H05B 45/20
 315/307
2016/0210908 A1 7/2016 Seki

* cited by examiner

LIQUID CRYSTAL DISPLAY DEVICE AND METHOD OF CONTROLLING THE SAME

CROSS REFERENCE TO RELATED APPLICATIONS

This application claims priority to U.S. Provisional Patent Application No. 62/692,442, entitled "LIQUID CRYSTAL DISPLAY DEVICE AND METHOD OF CONTROLLING THE SAME", filed on Jun. 29, 2018, the content of which is incorporated herein by reference.

BACKGROUND OF THE INVENTION

1. Field of the Invention

The following disclosure relates to a liquid crystal display device and a method of controlling the same.

2. Description of Related Art

A liquid crystal display device displays colors by additive color mixing of three primary colors. Accordingly, a transmissive liquid crystal display device needs a backlight which is capable of radiating, on a liquid crystal panel, white light including a red component, a green component, and a blue component. Conventionally, a cold cathode fluorescent lamp called CCFL is often adopted as a backlight source. However, in recent years, a light emitting diode (LED) is being used more often from the standpoint of low power consumption and the ease of luminance control, for example.

Such a liquid crystal display device sometimes adopts a driving method of intermittently lighting an LED as the backlight source (hereinafter referred to as "backlight impulse-driving") to suppress occurrence of moving picture blur (a phenomenon in which an image is blurred at the time of display of a moving picture). According to the backlight impulse-driving, a black screen is inserted by turning off the LED, and thus, occurrence of moving picture blur is suppressed.

The following Patent Literatures are known in relation to the present application. Japanese Laid-Open Patent Publication No. 2016-129098 discloses a technology of preventing sounding of an LED drive device performing PWM control of an LED by using a step-up chopper circuit. WO 2015/041012 A discloses a technology of dynamically controlling luminance of a backlight depending on image data. Japanese Laid-Open Patent Publication No. 2011-216876 relates to an LED drive device for performing PWM control of an LED, and discloses a technology of suppressing flickering of a screen of a liquid crystal display device including the LED drive device.

However, in a liquid crystal display device adopting the backlight impulse-driving, abnormal heat generation of an LED sometimes occurs. Abnormal heat generation of an LED may lead to deformation or ignition of various sheets (such as an optical sheet) and a plastic frame which constitute the backlight. A description is given below with respect to such an aspect.

Figure 13:
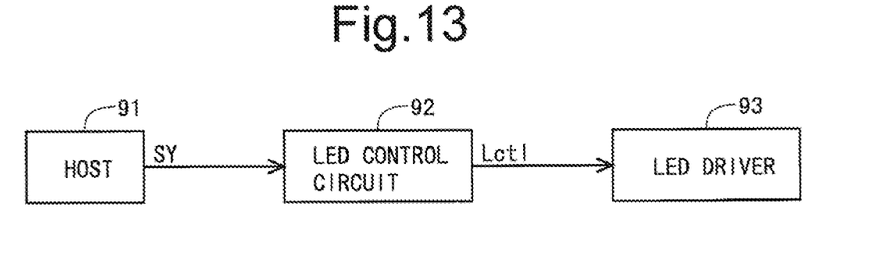
FIG. 13 is a block diagram for describing a conventional example.

In a liquid crystal display device adopting the backlight impulse-driving, an LED control circuit 92 that outputs an LED control signal Lct1 for performing PWM control of an LED is provided inside an LCD (liquid crystal display) driver, for example, and the LED control circuit 92 outputs, based on a display synchronization signal SY transmitted from a host 91, the LED control signal Lct1 to an LED driver 93 for controlling a drive current that is supplied to the LED (see FIG. 13). In this manner, in order to synchronize a lighting period of an LED as a backlight source and a display period of an image, lighting/non-lighting of the LED is controlled based on the display synchronization signal SY. The LED control signal Lct1 is a so-called PWM signal in which a high-level state and a low-level state are alternately repeated. Furthermore, the LED control signal Lct1 is applied to a gate terminal of a transistor (which is assumed to be of an n-channel type) provided in the LED driver 93, and a drive current is supplied to the LED by the transistor being placed in an on-state when the LED control signal Lct1 is in the high-level state.

Figure 14:
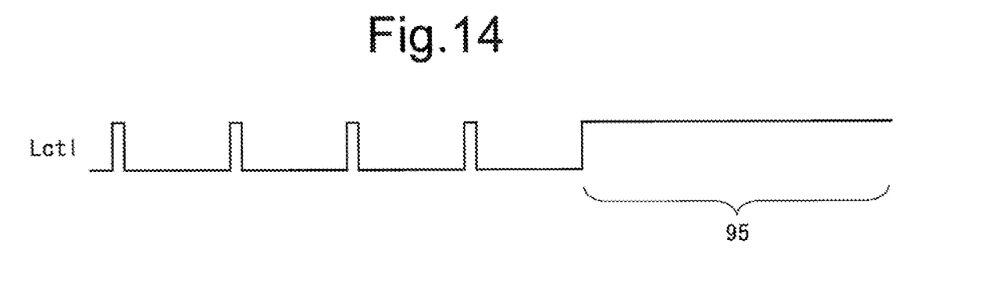
FIG. 14 is a diagram for describing a problem of the conventional example.

Under the circumstances described above, the display synchronization signal SY is sometimes failed to be normally input to the LED control circuit 92 due to some kind of connection failure, electrostatic discharge (ESD) or the like. Then, depending on a timing, the LED control signal Lct1 is maintained in the high-level state, as shown by apart denoted by a reference sign 95 in FIG. 14. In such a case, the drive current is continuously supplied to the LED.

In the meantime, in a case where dimming of an LED is to be performed by PWM control by a configuration not adopting the backlight impulse-driving, magnitude of the drive current is fixed to specific magnitude in a period when the drive current is being supplied to the LED. That is, luminance of the LED is adjusted based on a duty ratio of a PWM signal. The magnitude of the drive current is set equal to or less than magnitude of an allowable forward current of the LED when the duty ratio is 100%. Accordingly, even if the duty ratio reaches an unexpected value, a drive current exceeding an absolute rated current of the LED does not flow to the LED.

Figure 15:
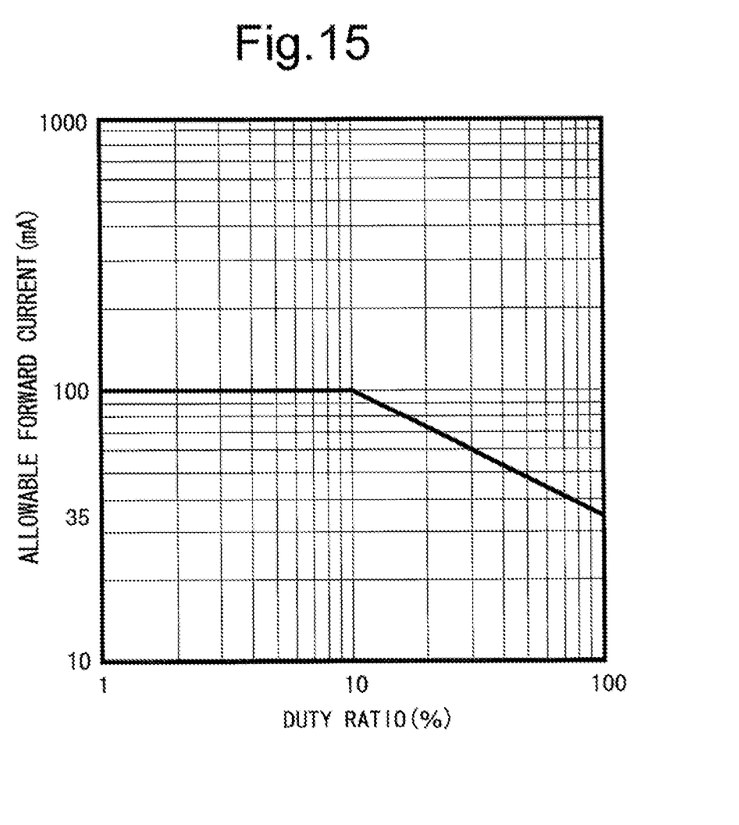
FIG. 15 is a diagram showing an example relationship between a duty ratio of a PWM signal and an allowable forward current.

On the other hand, in the case where the backlight impulse-driving is adopted, a duty ratio of the PWM signal (the LED control signal Lct1 mentioned above) is constant, and a drive current with magnitude of an allowable forward current at the duty ratio is supplied to the LED. For example, in the case where a relationship between the duty ratio of the PWM signal and the allowable forward current is a relationship as shown in FIG. 15, although only a drive current of magnitude up to 35 mA can be supplied to the LED when the duty ratio is 100%, a drive current of magnitude of 100 mA can be supplied to the LED when the duty ratio is 10%. Under such circumstances, if the PWM signal becomes fixed in the high-level state due to some kind of abnormality when the drive current of magnitude of 100 mA is supplied to the LED at duty ratio 10%, the drive current of 100 mA is continuously supplied to the LED. This may lead to abnormal heat generation of the LED as described above, thereby causing deformation or ignition of a constituent element of the backlight.

SUMMARY OF THE INVENTION

Accordingly, it is desired to prevent abnormal heat generation of an LED in a liquid crystal display device adopting backlight impulse-driving.

(1) Liquid crystal display devices according to several embodiments of the present invention are each a liquid crystal display device including:

a display unit configured to display an image;

a light source configured to radiate light on the display unit;

a light source control unit configured to output a PWM signal with a constant duty ratio based on a display synchronization signal, such that the light source is intermittently lighted;

a light source drive unit configured to control a drive current that is supplied to the light source, based on the PWM signal outputted from the light source control unit; and a monitoring control unit configured to monitor at least one of the PWM signal, the drive current, and the display synchronization signal, as a monitoring target, and control, when an abnormality of the monitoring target is detected, a waveform of the PWM signal such that the drive current that is supplied to the light source becomes zero.

According to such a configuration, at least one of the PWM signal for controlling the light source, the drive current that is supplied to the light source, and the display synchronization signal is monitored by the monitoring control unit. When an abnormality of the monitoring target is detected, the waveform of the PWM signal is controlled such that the drive current that is supplied to the light source becomes zero. Accordingly, even if the PWM signal is fixed in an on-level state due to some kind of abnormality, the PWM signal immediately becomes fixed in an off-level state. Therefore, an excessively large current does not flow to the light source over a long period of time, and abnormal heat generation of the light source is prevented. Here, the light source control unit outputs the PWM signal with a constant duty ratio such that the light source is intermittently lighted. That is, backlight impulse-driving is adopted. Accordingly, abnormal heat generation of the light source in a liquid crystal display device adopting backlight impulse-driving is prevented.

(2) Moreover, liquid crystal display devices according to several embodiments of the present invention are each a liquid crystal display device image display including the configuration of above (1), wherein the liquid crystal display device further includes a display drive unit configured to drive the display unit based on an image signal and the display synchronization signal, and the light source control unit is provided in the display drive unit.

(3) Moreover, liquid crystal display devices according to several embodiments of the present invention are each a liquid crystal display device image display including the configuration of above (2), wherein the liquid crystal display device further includes a host configured to supply the image signal and the display synchronization signal to the display drive unit.

(4) Moreover, liquid crystal display devices according to several embodiments of the present invention are each a liquid crystal display device image display including the configuration of above (3), wherein the monitoring control unit is provided in the host.

(5) Moreover, liquid crystal display devices according to several embodiments of the present invention are each a liquid crystal display device image display including the configuration of above (4), wherein the monitoring control unit initializes the display drive unit and the light source drive unit when an abnormality of the monitoring target is detected.

(6) Moreover, liquid crystal display devices according to several embodiments of the present invention are each a liquid crystal display device image display including the configuration of above (3), wherein the monitoring control unit is provided in the display drive unit.

(7) Moreover, liquid crystal display devices according to several embodiments of the present invention are each a liquid crystal display device image display including the configuration of above (6), wherein the monitoring control unit initializes the display drive unit, the light source drive unit, and the host when an abnormality of the monitoring target is detected.

(8) Moreover, liquid crystal display devices according to several embodiments of the present invention are each a liquid crystal display device image display including the configuration of above (3), wherein the monitoring control unit is provided in the light source drive unit.

(9) Moreover, liquid crystal display devices according to several embodiments of the present invention are each a liquid crystal display device image display including the configuration of above (8), wherein the monitoring control unit initializes the display drive unit, the light source drive unit, and the host when an abnormality of the monitoring target is detected.

(10) Moreover, liquid crystal display devices according to several embodiments of the present invention are each a liquid crystal display device image display including the configuration of above (2), wherein the monitoring control unit initializes the display drive unit and the light source drive unit when an abnormality of the monitoring target is detected.

(11) Moreover, liquid crystal display devices according to several embodiments of the present invention are each a liquid crystal display device image display including the configuration of any one of above (1) to (10), wherein the monitoring control unit takes the PWM signal as the monitoring target, and determines that an abnormality is caused in the monitoring target when an on period of the PWM signal becomes longer than a predetermined period.

(12) Moreover, liquid crystal display devices according to several embodiments of the present invention are each a liquid crystal display device image display including the configuration of any one of above (1) to (10), wherein the monitoring control unit takes the drive current as the monitoring target, and determines that an abnormality is caused in the monitoring target when a state where magnitude of the drive current is equal to or greater than predetermined magnitude continues for longer than a predetermined period.

(13) Moreover, control methods of a liquid crystal display device according to several embodiments of the present invention are each a control method of a liquid crystal display device including a display unit configured to display an image, a light source configured to radiate light on the display unit, a light source control unit configured to output a PWM signal with a constant duty ratio based on a display synchronization signal, such that the light source is intermittently lighted, and a light source drive unit configured to control a drive current that is supplied to the light source, based on the PWM signal outputted from the light source control unit, the control method including the steps of:

monitor at least one of the PWM signal, the drive current, and the display synchronization signal, as a monitoring target; and controlling, when an abnormality of the monitoring target is detected, a waveform of the PWM signal such that the drive current that is supplied to the light source becomes zero.

These and other objects, features, aspects, and effects of the present invention will be made more clear from the following detailed description of the present invention with reference to the accompanying drawings.

DETAILED DESCRIPTION OF PREFERRED EMBODIMENTS

Hereinafter, embodiments of the present invention will be described with reference to the drawings.

0. Introduction

<0.1 Overall Configuration>

Figure 2:
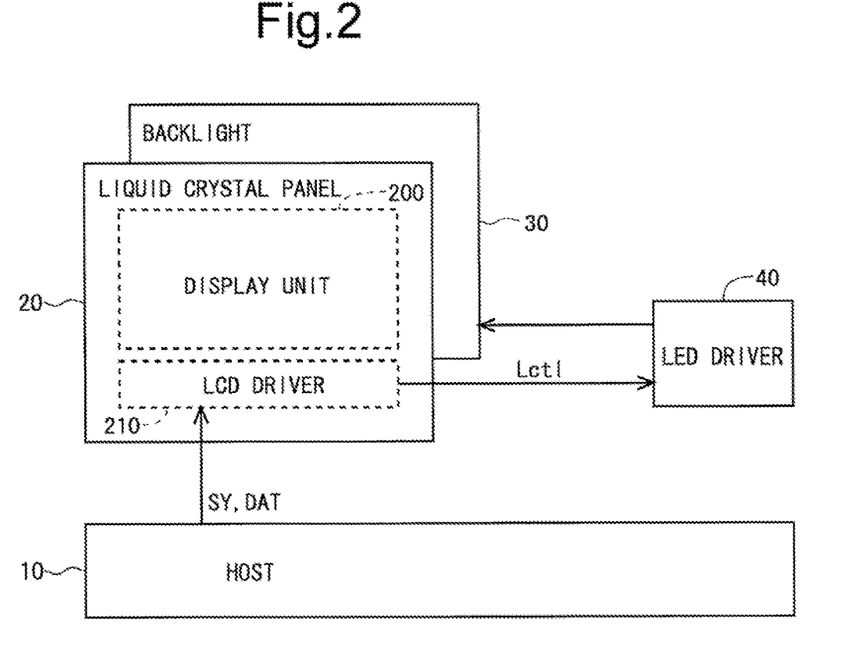
FIG. 2 is a block diagram showing an overall configuration of a liquid crystal display device according to all embodiments.

Before describing each embodiment in detail, matters common to all embodiments will be described. FIG. 2 is a block diagram showing an overall configuration of a liquid crystal display device according to all the embodiments. As shown in FIG. 2, the liquid crystal display device includes a host 10, a liquid crystal panel 20, a backlight 30, and an LED driver 40. The liquid crystal panel 20 includes a display unit 200 and an LCD driver 210. The LCD driver 210 is mounted, in a form of an IC chip, on a glass substrate forming the liquid crystal panel 20. For example, the LED driver 40 is mounted, in a form of an IC chip, on a substrate for the backlight 30. The host 10, the LED driver 40, and the LCD driver 210 each include a reset terminal, and are each configured to be initialized when a reset signal is applied to the reset terminal. It should be noted that this liquid crystal display device is applied to a mobile phone such as a smartphone, or a head-mounted display, for example.

Figure 3:
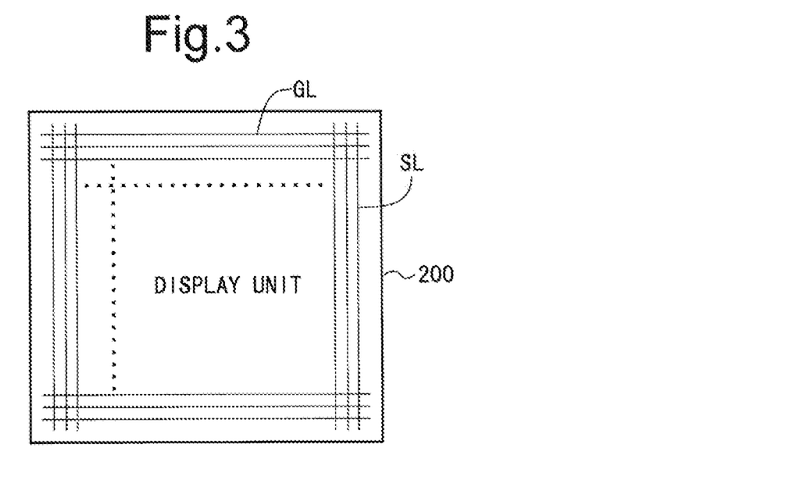
FIG. 3 is a diagram for describing a configuration of a display unit according to all the embodiments.
Figure 4:
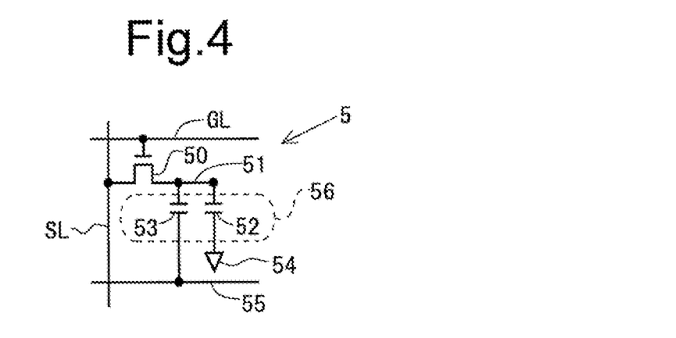
FIG. 4 is a circuit diagram showing a configuration of a pixel formation portion according to all the embodiments.

As shown in FIG. 3, a plurality of source bus lines (video signal lines) SL and a plurality of gate bus lines (scanning signal lines) GL are arranged in the display unit 200. A pixel formation portion 5 (see FIG. 4) forming a pixel is provided at each intersection point of the plurality of source bus lines SL and the plurality of gate bus lines GL. That is, the display unit 200 includes a plurality of pixel formation portions 5. As shown in FIG. 4, each pixel formation portion 5 includes a TFT (pixel TFT) 50 which is a switching element whose gate terminal is connected to the gate bus line GL passing through a corresponding intersection point and whose source terminal is connected to the source bus line SL passing through the intersection point; a pixel electrode 51 connected to a drain terminal of the TFT 50; a common electrode 54 and an auxiliary capacitance electrode 55 which are provided in a shared manner for the plurality of pixel formation portions 5; a liquid crystal capacitance 52 formed by the pixel electrode 51 and the common electrode 54; and an auxiliary capacitance 53 formed by the pixel electrode 51 and the auxiliary capacitance electrode 55. A pixel capacitance 56 is formed by the liquid crystal capacitance 52 and the auxiliary capacitance 53.

In the following, operation of constituent elements shown in FIG. 2 will be described. The host 10 outputs, to the liquid crystal panel 20, image data DAT and a display synchronization signal SY that is a timing signal. The display synchronization signal SY includes a horizontal synchronization signal and a vertical synchronization signal. Transmission of the image data DAT and the display synchronization signal SY from the host 10 to the liquid crystal panel 20 is performed through an MIPI interface. However, the present invention is not limited to this. Transmission of the image data DAT and the display synchronization signal SY may be performed through an interface other than the MIPI interface.

Figure 5:
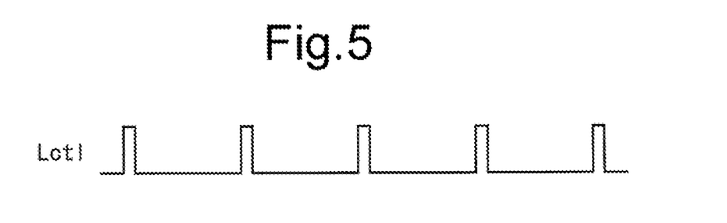
FIG. 5 is a diagram showing an example waveform of an LED control signal according to all the embodiments.

The LCD driver 210 drives the display unit 200 based on the image data DAT and the display synchronization signal SY (more specifically, as described later, a gate driver applies a scanning signal to each gate bus line GL, and a source driver applies a driving video signal to each source bus line SL). Furthermore, the LCD driver 210 outputs an LED control signal Lct1 to the LED driver 40 based on the display synchronization signal SY. The liquid crystal display device adopts backlight impulse-driving. Accordingly, the LED control signal Lct1 that is outputted from the LCD driver 210 to the LED driver 40 is a PWM signal in which a high-level state and a low-level state are alternately repeated at predetermined intervals (see FIG. 5).

Figure 6:
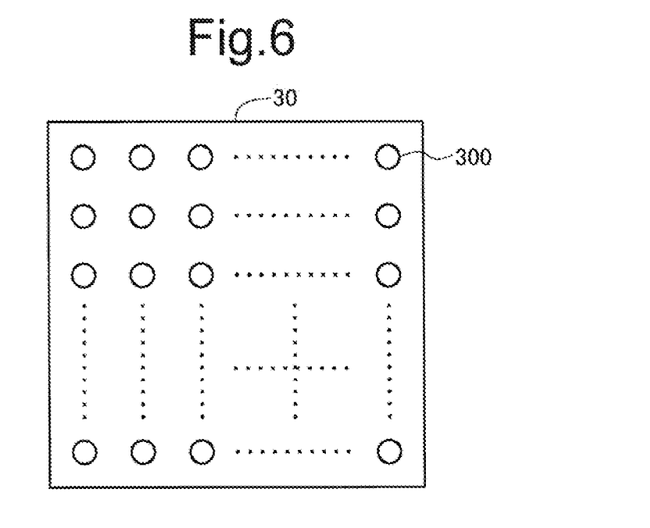
FIG. 6 is a schematic diagram showing a configuration of a backlight according to all the embodiments.

For example, the backlight 30 is formed by a plurality of LEDs 300 for radiating light on the display unit 200, schematically as shown in FIG. 6. The LED driver 40 controls supply/non-supply of a drive current to the LED 300 in the backlight 30 depending on a duty ratio of the LED control signal Lct1. It should be noted that a light source drive unit is implemented by the LED driver 40. For example, the duty ratio of the LED control signal Lct1 is set to 10%. In this case, when a relationship between the duty ratio of the LED control signal Lct1 and an allowable forward current is a relationship as shown in FIG. 15, a drive current of 100 mA is supplied to the LED 300 in a period when the LED control signal Lct1 is at a high level. The drive current is not supplied to the LED 300 in a period when the LED control signal Lct1 is at a low level. Accordingly, the LED 300 in the backlight 30 blinks on and off (is intermittently lighted) depending on the duty ratio of the LED control signal Lct1.

An image based on the image data DAT is displayed on the display unit 200 by each constituent element operating in the above manner. Because the LED 300 in the backlight 30 blinks on and off depending on the duty ratio of the LED control signal Lct1 as described above, a black screen is inserted, and therefore occurrence of moving picture blur is suppressed.

<0.2 Configuration of LCD Driver>

Figure 7:
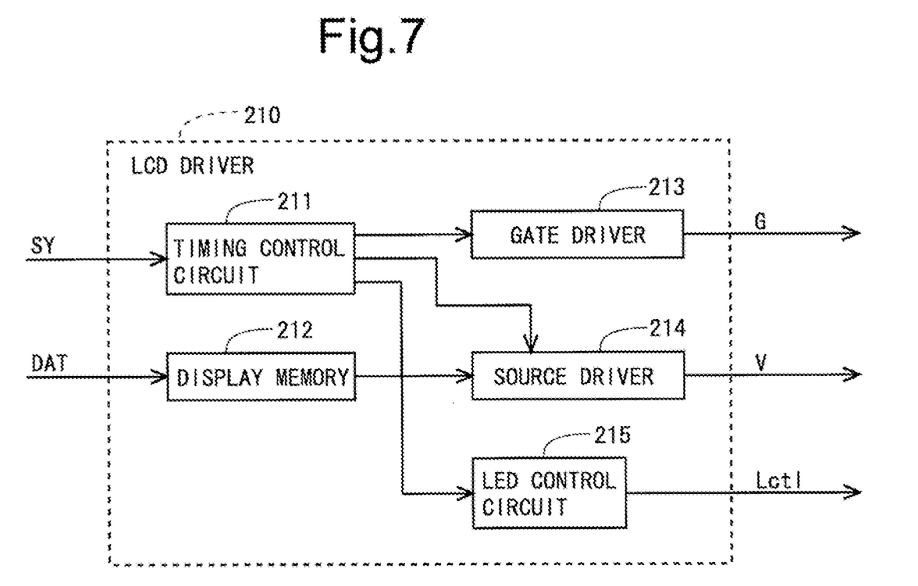
FIG. 7 is a block diagram showing an example configuration of an LED driver according to all the embodiments.

Next, details of the LCD driver 210 will be given. FIG. 7 is a block diagram showing an example configuration of the LCD driver 210. It should be noted that the configuration shown in FIG. 7 is an example, and the present invention is not limited thereto. As shown in FIG. 7, the LCD driver 210 includes a timing control circuit 211, a display memory 212, a gate driver 213, a source driver 214, and an LED control circuit 215.

The timing control circuit 211 controls operation of the gate driver 213, the source driver 214, and the LED control circuit 215 based on the display synchronization signal SY transmitted from the host 10. The image data DAT transmitted from the host 10 is stored in the display memory 212. The gate driver 213 applies a scanning signal G to each gate bus line GL based on control by the timing control circuit 211. The source driver 214 refers to the image data DAT stored in the display memory 212, and applies a driving video signal V to each source bus line SL based on control by the timing control circuit 211. The LED control circuit 215 outputs the LED control signal Lct1, which is a PWM signal with a constant duty ratio, based on control by the timing control circuit 211.

It should be noted that a display drive unit is implemented by the LCD driver 210, and a light source control unit is implemented by the LED control circuit 215.

<0.3 Features>

Next, features common to all the embodiments will be described. The liquid crystal display device according to all the embodiments is provided with a monitoring control unit for monitoring at least one of the LED control signal Lct1, the drive current that is supplied to the LED 300 in the backlight 30, and the display synchronization signal SY, as a monitoring target. When detecting an abnormality in the monitoring target, the monitoring control unit controls a waveform of the LED control signal Lct1 in such a way that the drive current that is supplied to the LED 300 in the backlight 30 becomes zero. In the following, first to third embodiments will be described in detail.

1. First Embodiment

<1.1 Configuration>

Figure 1:
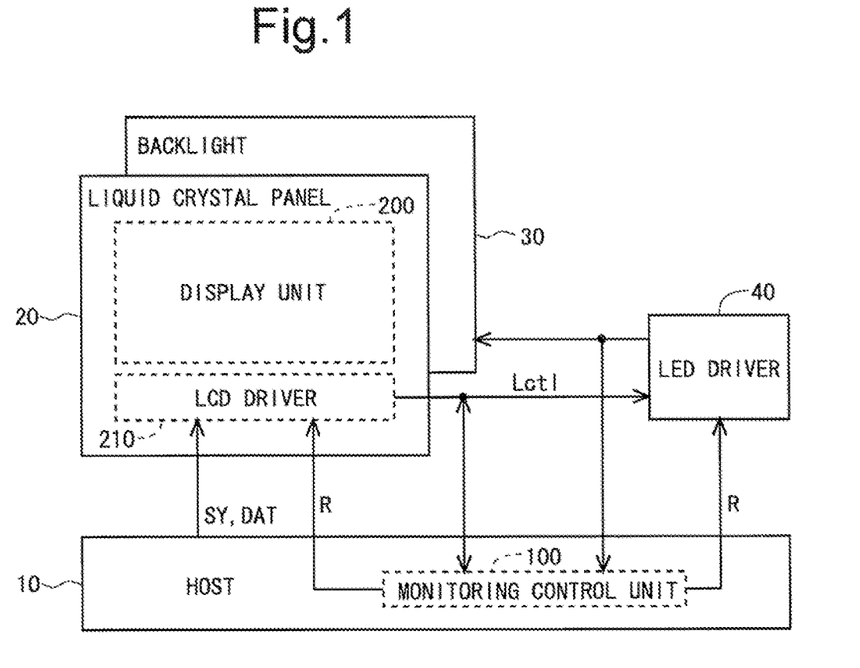
FIG. 1 is a block diagram showing an overall configuration of a liquid crystal display device according to a first embodiment.

FIG. 1 is a block diagram showing an overall configuration of a liquid crystal display device according to a first embodiment. As shown in FIG. 1, in the present embodiment, a monitoring control unit 100 is provided in the host 10.

The monitoring control unit 100 monitorsing the LED control signal Lct1 or the drive current that is supplied to the LED 300 in the backlight 30, as the monitoring target. In the case where the monitoring target is the LED control signal Lct1, for example, the monitoring control unit 100 continuously measures a signal level of the LED control signal Lct1, and counts a period during which the signal level is maintained at a high level. Then, when a count value obtained as a result exceeds a threshold set in advance, the monitoring control unit 100 makes a determination that an abnormality is caused in the monitoring target. In this manner, in the case where the monitoring target is the LED control signal Lct1, the monitoring control unit 100 determines that an abnormality is caused in the monitoring target, when an on period (period when the high level is maintained) of the LED control signal Lct1, which is a PWM signal, becomes longer than a predetermined period. In the case where the monitoring target is the drive current, for example, the monitoring control unit 100 continuously measures magnitude of the drive current based on voltages at both ends of a resistor provided on a path of the drive current, and counts a period during which the magnitude of the drive current is equal to or greater than predetermined magnitude. Then, when a count value obtained as a result exceeds a threshold set in advance, the monitoring control unit 100 makes a determination that an abnormality is caused in the monitoring target. In this manner, in the case where the monitoring target is the drive current, the monitoring control unit 100 determines that an abnormality is caused in the monitoring target, when a state where the magnitude of the drive current is equal to or greater than predetermined magnitude continues for longer than a predetermined period.

Figures 8, 9:
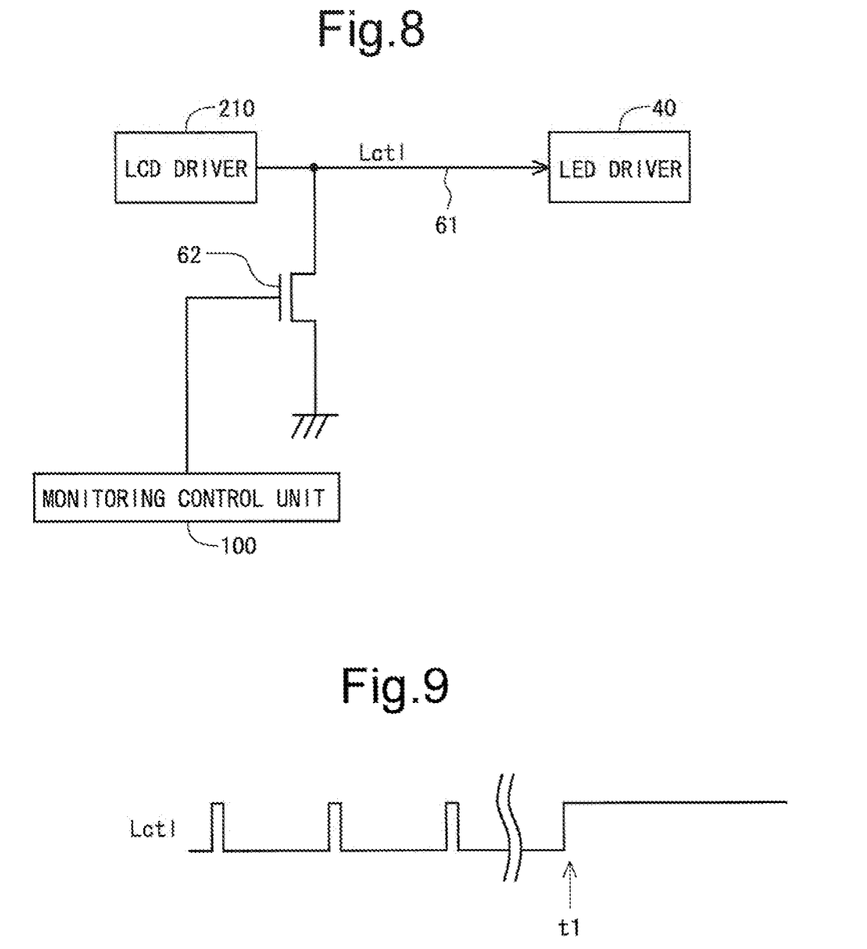
FIG. 8 is a circuit diagram for describing a configuration for fixing an LED control signal at a low level, according to the first embodiment.
FIG. 9 is a diagram for describing an advantageous effect according to the first embodiment.

When an abnormality of the monitoring target is detected, the monitoring control unit 100 forcibly fixes the state of the LED control signal Lct1 in the low-level state such that the drive current that is supplied to the LED 300 in the backlight 30 becomes zero. With respect to this point, the liquid crystal display device is provided, as shown in FIG. 8, with a TFT 62, a gate terminal of which is connected to the monitoring control unit 100, a drain terminal of which is connected to a line 61 between the LCD driver 210 and the LED driver 40, and a source terminal of which is grounded. When an abnormality of the monitoring target is detected, the monitoring control unit 100 places the TFT 62 in an on state. The LED control signal Lct1 is thereby fixed in the low-level state.

Moreover, after fixing the LED control signal Lct1 in the low-level state, the monitoring control unit 100 applies a reset signal R to the LCD driver 210 and the LED driver 40. The LCD driver 210 and the LED driver 40 are thereby initialized (reactivated).

<1.2 Advantageous Effect>

Figure 10:
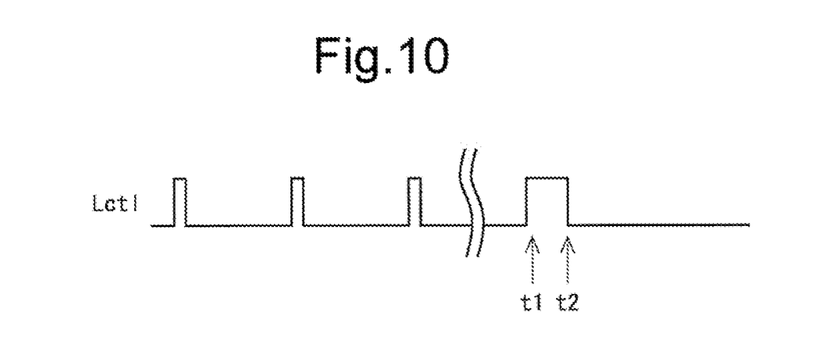
FIG. 10 is a diagram for describing an advantageous effect according to the first embodiment.

According to the present embodiment, a state of the LED control signal Lct1 or a supply state of the drive current to the LED 300 in the backlight 30 is monitored by the monitoring control unit 100 provided in the host 10. When a state where the drive current is supplied to the LED 300 continues for longer than a period set in advance, the state of the LED control signal Lct1 becomes forcibly fixed at the low level, and the LCD driver 210 and the LED driver 40 are reactivated. Accordingly, even if the LED control signal Lct1 is fixed in the high-level state by operation of the LCD driver 210 being stopped due to an abnormality in the MIPI interface, for example, the state of the LED control signal Lct1 becomes immediately fixed in the low-level state. For example, according to a conventional example, if an abnormality occurs at a time t1, the LED control signal Lct1 is maintained in the high-level state, as shown in FIG. 9. On the other hand, according to the present embodiment, even if an abnormality occurs at the time t1, the LED control signal Lct1 is changed from the high-level state to the low-level state at time t2 based on control by the monitoring control unit 100, as shown in FIG. 10. Accordingly, an excessively large current does not flow to the LED 300 in the backlight 30 over a long period of time, and abnormal heat generation of the LED 300 is prevented. The liquid crystal display device according to the present embodiment adopts the backlight impulse-driving. From the above, according to the present embodiment, abnormal heat generation of the LED 300 in a liquid crystal display device adopting the backlight impulse-driving is prevented.

2. Second Embodiment

<2.1 Configuration>

Figure 11:
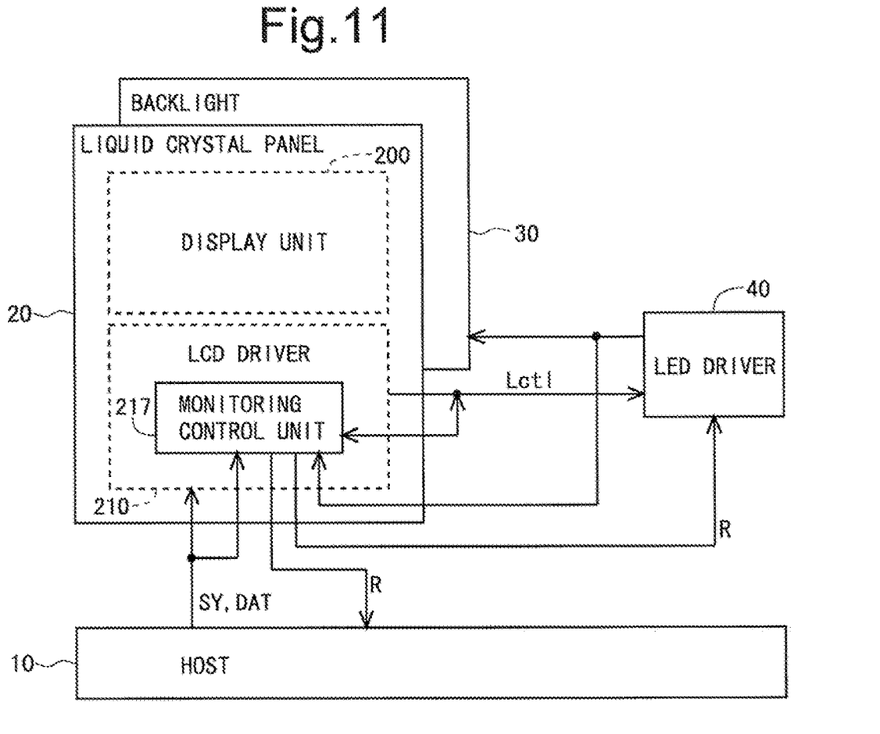
FIG. 11 is a block diagram showing an overall configuration of a liquid crystal display device according to a second embodiment.

FIG. 11 is a block diagram showing an overall configuration of a liquid crystal display device according to a second embodiment. As shown in FIG. 11, according to the present embodiment, a monitoring control unit 217 is provided in the LCD driver 210.

The monitoring control unit 217 monitors at least one of the LED control signal Lct1, the drive current that is supplied to the LED 300 in the backlight 30, and the display synchronization signal SY, as a monitoring target. In the case where the monitoring target is the LED control signal Lct1, as in the first embodiment described above, the monitoring control unit 217 determines that an abnormality is caused in the monitoring target, when an on period (period when the high level is maintained) of the LED control signal Lct1, which is a PWM signal, becomes longer than a predetermined period. In the case where the monitoring target is the drive current, as in the first embodiment described above, the monitoring control unit 217 determines that an abnormality is caused in the monitoring target, when a state where the magnitude of the drive current is equal to or greater than predetermined magnitude continues for longer than a predetermined period. In the case where the monitoring target is the display synchronization signal SY, the monitoring control unit 217 determines that an abnormality is caused in the monitoring target, for example, when a signal level of the display synchronization signal SY is maintained constant over a period of time longer than a predetermined period.

When an abnormality of the monitoring target is detected, the monitoring control unit 217 forcibly fixes the state of the LED control signal Lct1 in the low-level state such that the drive current that is supplied to the LED 300 in the backlight 30 becomes zero. Furthermore, the monitoring control unit 217 applies the reset signal R to the LED driver 40. The LED driver 40 is thereby initialized (reactivated). Moreover, the monitoring control unit 217 applies the reset signal R to the host 10. The host 10 is thereby initialized (reactivated). Moreover, the monitoring control unit 217 initializes (reactivates) the LCD driver 210.

<2.2 Advantageous Effect>

According to the present embodiment, as in the first embodiment described above, abnormal heat generation of the LED in a liquid crystal display device adopting the backlight impulse-driving is prevented.

3. Third Embodiment

<3.1 Configuration>

Figure 12:
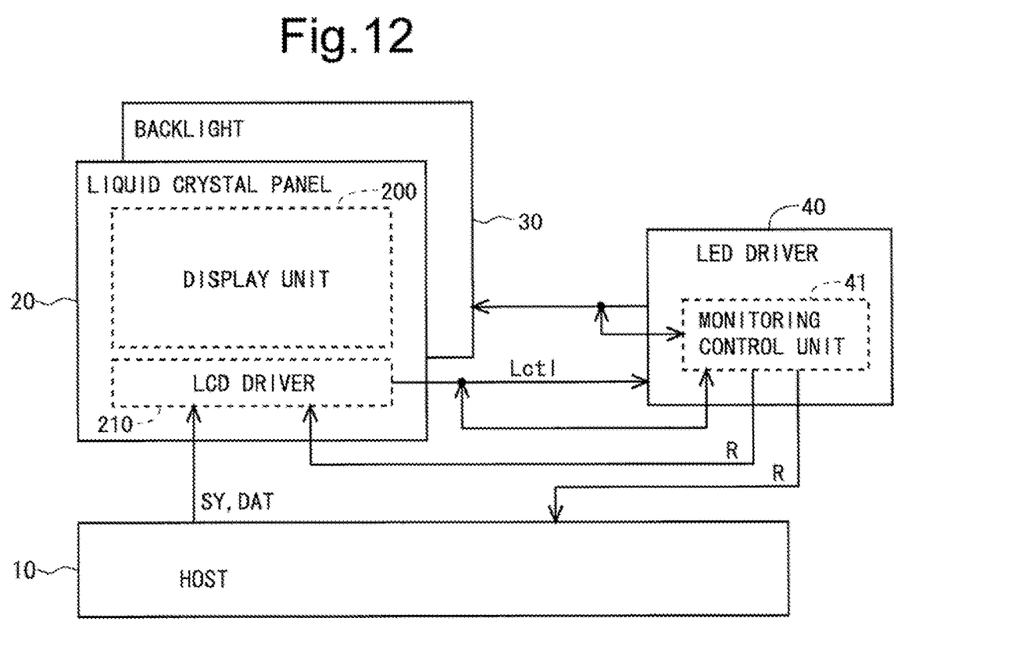
FIG. 12 is a block diagram showing an overall configuration of a liquid crystal display device according to a third embodiment.

FIG. 12 is a block diagram showing an overall configuration of a liquid crystal display device according to a third embodiment. As shown in FIG. 12, in the present embodiment, a monitoring control unit 41 is provided in the LED driver 40.

The monitoring control unit 41 monitors the LED control signal Lct1 or the drive current that is supplied to the LED 300 in the backlight 30, as a monitoring target. In the case where the monitoring target is the LED control signal Lct1, as in the first embodiment, the monitoring control unit 41 determines that an abnormality is caused in the monitoring target, when an on period (period when the high level is maintained) of the LED control signal Lct1, which is a PWM signal, becomes longer than a predetermined period. In the case where the monitoring target is the drive current, as in the first embodiment described above, the monitoring control unit 41 determines that an abnormality is caused in the monitoring target, when a state where the magnitude of the drive current is equal to or greater than predetermined magnitude continues for longer than a predetermined period.

When an abnormality of the monitoring target is detected, the monitoring control unit 41 forcibly fixes the state of the LED control signal Lct1 in the low-level state such that the drive current that is supplied to the LED 300 in the backlight 30 becomes zero. Furthermore, the monitoring control unit 41 applies the reset signal R to the LCD driver 210. The LCD driver 210 is thereby initialized (reactivated). Moreover, the monitoring control unit 41 applies the reset signal R to the host 10. The host 10 is thereby initialized (reactivated).

Moreover, the monitoring control unit 41 initializes (reactivates) the LED driver 40.

<3.2 Advantageous Effect>

According to the present embodiment, as in the first embodiment described above, abnormal heat generation of the LED in a liquid crystal display device adopting the backlight impulse-driving is prevented.

4. Others

In each of the embodiments described above, the monitoring control unit is provided in any one of the host 10, the LCD driver 210, and the LED driver 40. However, the present invention is not limited to this. The monitoring control unit may be provided in two or all of the host 10, the LCD driver 210, and the LED driver 40. This enables an abnormality to be more reliably detected, and enables abnormal heat generation of the LED 300 in the backlight 30 to be more reliably prevented. It should be noted that the monitoring control unit may also be provided at a part other than "the host 10, the LCD driver 210, and the LED driver 40".

Heretofore, the present invention has been described in detail, but the description given above is illustrative in all aspects and is not restrictive. Numerous other changes and modifications are conceivable without departing from the scope of the present invention.

What is claimed is:

1. A liquid crystal display device comprising:
   a display unit configured to display an image;
   a light source configured to radiate light on the display unit;
   a light source control unit configured to output a PWM signal with a constant duty ratio based on a display synchronization signal, such that the light source is intermittently lighted;
   a light source drive unit configured to control a drive current that is supplied to the light source, based on the PWM signal outputted from the light source control unit; and
   a monitoring control unit configured to monitor at least one of the PWM signal, the drive current, and the display synchronization signal, as a monitoring target, and control, when an abnormality of the monitoring target is detected, a waveform of the PWM signal such that the drive current that is supplied to the light source becomes zero.

2. The liquid crystal display device according to claim 1, further comprising a display drive unit configured to drive the display unit based on an image signal and the display synchronization signal, wherein the light source control unit is provided in the display drive unit.

3. The liquid crystal display device according to claim 2, further comprising a host configured to supply the image signal and the display synchronization signal to the display drive unit.

4. The liquid crystal display device according to claim 3, wherein the monitoring control unit is provided in the host.

5. The liquid crystal display device according to claim 4, wherein the monitoring control unit initializes the display drive unit and the light source drive unit when an abnormality of the monitoring target is detected.

6. The liquid crystal display device according to claim 3, wherein the monitoring control unit is provided in the display drive unit.

7. The liquid crystal display device according to claim 6, wherein the monitoring control unit initializes the display drive unit, the light source drive unit, and the host when an abnormality of the monitoring target is detected.

8. The liquid crystal display device according to claim 3, wherein the monitoring control unit is provided in the light source drive unit.

9. The liquid crystal display device according to claim 8, wherein the monitoring control unit initializes the display drive unit, the light source drive unit, and the host when an abnormality of the monitoring target is detected.

10. The liquid crystal display device according to claim 2, wherein the monitoring control unit initializes the display drive unit and the light source drive unit when an abnormality of the monitoring target is detected.

11. The liquid crystal display device according to claim 1, wherein the monitoring control unit takes the PWM signal as the monitoring target, and determines that an abnormality is caused in the monitoring target when an on period of the PWM signal becomes longer than a predetermined period.

12. The liquid crystal display device according to claim 1, wherein the monitoring control unit takes the drive current as the monitoring target, and determines that an abnormality is caused in the monitoring target when a state where magnitude of the drive current is equal to or greater than predetermined magnitude continues for longer than a predetermined period.

13. A control method of a liquid crystal display device including a display unit configured to display an image, a light source configured to radiate light on the display unit, a light source control unit configured to output a PWM signal with a constant duty ratio based on a display synchronization signal, such that the light source is intermittently lighted, and a light source drive unit configured to control a drive current that is supplied to the light source, based on the PWM signal outputted from the light source control unit, the control method comprising the steps of:

monitor at least one of the PWM signal, the drive current, and the display synchronization signal, as a monitoring target; and controlling, when an abnormality of the monitoring target is detected, a waveform of the PWM signal such that the drive current that is supplied to the light source becomes zero.

* * * * *